United States Patent [19]

Albonesi

[11] Patent Number: 5,170,113
[45] Date of Patent: Dec. 8, 1992

[54] ELECTRIC CABLE CONNECTION ERROR-DETECT METHOD AND APPARATUS

[75] Inventor: David H. Albonesi, Hudson, Mass.

[73] Assignee: Prime Computer, Inc., Bedford, Mass.

[21] Appl. No.: 702,360

[22] Filed: May 15, 1991

Related U.S. Application Data

[63] Continuation of Ser. No. 382,299, Jul. 20, 1989, abandoned.

[51] Int. Cl.$^5$ ............................................. G01R 31/02
[52] U.S. Cl. ..................................... 324/66; 324/539
[58] Field of Search ................. 324/66, 539, 540, 542; 379/10, 25, 26

[56] References Cited

U.S. PATENT DOCUMENTS 3,818,329 6/1974 Reaves, Jr. ........................ 324/66 X
4,257,002 3/1981 Helms et al. ......................... 324/66
4,620,282 10/1986 Shelley ............................. 324/66 X
4,772,845 9/1988 Scott ................................... 324/66

Primary Examiner—Kenneth A. Wieder
Attorney, Agent, or Firm—Wolf, Greenfield & Sacks

[57] ABSTRACT

A method and apparatus for detecting an improper connection of one or more cables to signal a cable misconnection error. On a board at one end of the cable there is provided a transmit circuit unique to one of the pins or sockets of the connector and at the other end of the cable at an opposite board there is provided a receive circuit that, when the cable is properly connected, receives the signal from the transmit circuit. A misconnection of the cable eliminates the signal from the transmit circuit thus signaling an error at the receive circuit. In addition, semi-dedicated connector positions are also employed so as to assure a detection of a number of different misconnections of the cable, particularly in a multi-cable system.

23 Claims, 10 Drawing Sheets

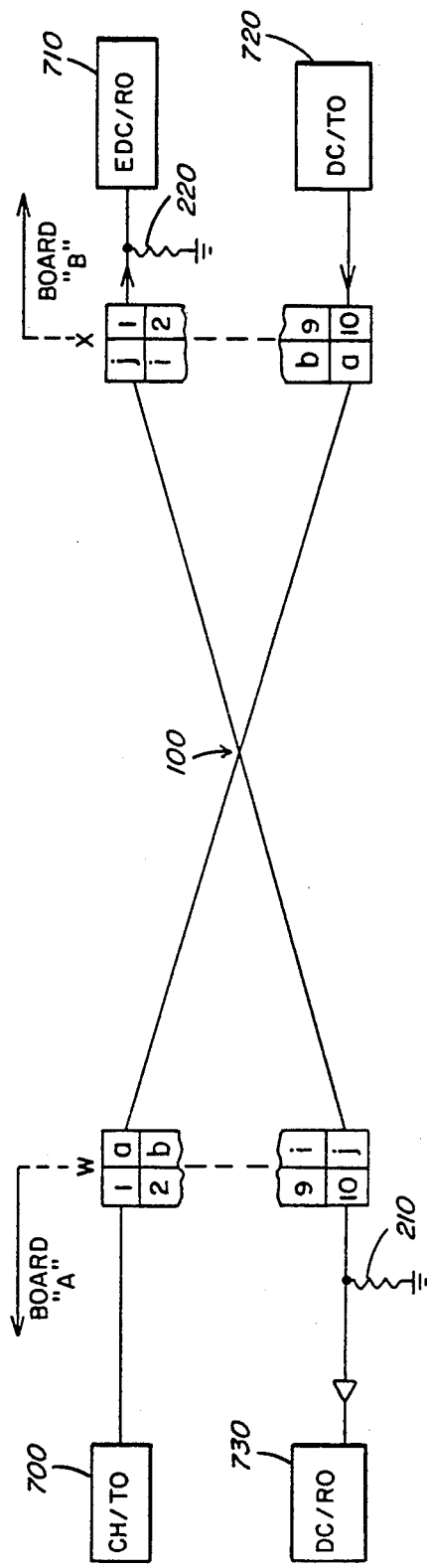
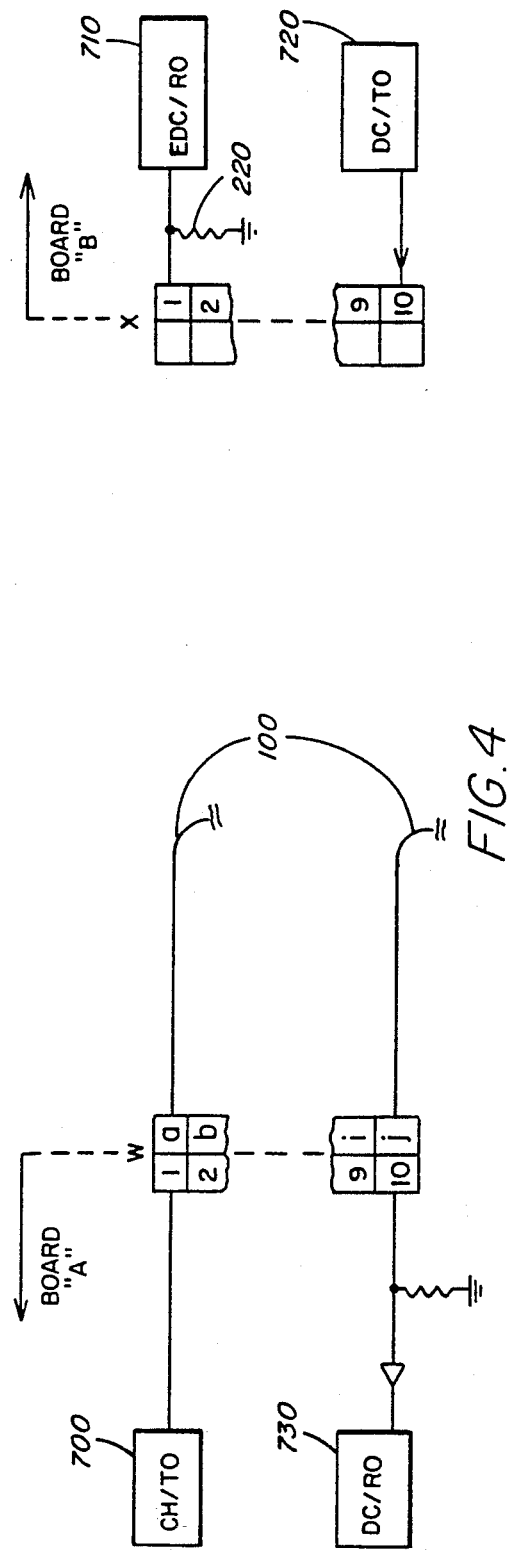
FIG. 3
FIG. 4

ELECTRIC CABLE CONNECTION ERROR-DETECT METHOD AND APPARATUS

This application is a continuation of application Ser. No. 07/382,299, filed Jul. 20, 1989, abandoned.

BACKGROUND OF THE INVENTION

1. Field of the Invention

The present invention relates in general to the field of cable connection error detection. More particularly, the present invention relates to an improved electrical means for detecting the misconnection of cables.

2. Background Discussion

The great number of circuit boards used in today's electronic digital computers require many cables, usually of the multi-line ribbon type, for interconnection between the boards and from boards to the computer mainframe itself. When a computer is installed, or after it has had its boards removed for servicing, scores of these cables must be connected. Due to the great number of these cables, as well as the symmetrical shape of a typical ribbon cable and connector, it is quite easy for an installer to wrongly connect one or more cables.

There are many types of cabling errors which may be committed when installing cables. For example, an installer may connect one end of a cable properly to a socket on one board, then unintentionally twist the cable before connecting the other end to the other socket on another board. This results in improper connection between the two sockets, and hence may be called a "twisted cable" error. Another common error results when an installer connects a cable between the wrong two sockets. This is referred to as a "misplugging error." Yet another type of error occurs when the installer connects the cable to two sockets on the same board, rather than from a socket on one board to its corresponding socket on another. This is referred to as a "reversed plugging" error.

It is easily seen that any of the above errors, which can occur separately or in combination, will result in a faulty correspondence between the subsockets of each interconnected socket. This will usually result in faulty operation of the computer. To prevent this faulty operation, a number of schemes have been devised to detect proper connection of cables.

One scheme for detecting the proper connection of cables is a mechanical technique. This involves the use of "keying". In essence this involves providing special markings for each cable connector pair. This mechanical technique may assist in preventing the improper connection of cables. However, the mechanical technique does not detect these errors should they occur.

Another scheme involves inputting data at the pins of a cable at the driving end, transmitting this data through the cable into the board into the receiving end of the cable, and reading this data out of the board at the receiving end. One technique employs scan registers at both ends of the cable. With this technique, a pattern is scanned into one end of the cable, clocking occurs and the results are scanned out at the other end of the cable and essentially compared with expected results. However, one of the problems with this scan technique is that it can only be used in systems which have scan functionality incorporated therein. It is typical for only more complicated computer systems to use such scan hardware. Moreover, the scan technique does require substantial extra hardware. Furthermore, this technique requires using the valuable processing time of the computer for the performance of a rather mundane task.

Accordingly, it is an object of the present invention to provide an improved method and apparatus for cable connection errors which requires the use of little additional hardware and processing time and which can be relatively inexpensively implemented.

Another object of the present invention is to provide an improved method and apparatus for detecting proper and improper connection of cables and in which this is carried out essentially automatically so that whenever a cable is plugged in improperly there is an immediate automatic detection thereof.

SUMMARY OF THE INVENTION

To accomplish the foregoing and other objects, features and advantages of the invention there is provided an apparatus for detecting improper connection of at least one cable that has multiple cable lines and that is adapted for connection between a connector means of separately disposed first and second circuit boards or the like, and in which each connector means has a plurality of connector members corresponding to the number of cable lines. In the following detailed description, the connector means will be identified as being comprised of sockets on the board and associated male connector pins of the cable itself. It is to be realized that although the invention may be implemented by the use of a male-to male cable with female sockets, in alternate embodiments of the invention other forms of connector may be employed.

In accordance with the apparatus of the present invention, means are provided associated with the first circuit board connector means for establishing on one of said lines a predetermined electrical signal identifiable as a correct cable connection signal. Means are also provided associated with the second circuit board connector means for receiving from said line said predetermined electrical signal and generating an error signal in the absence of this predetermined electrical signal. The successful reception of the predetermined signal from the means for establishing indicates proper connection of the cable between circuit boards. On the other hand a failure to receive this predetermined electrical signal indicates improper connection of the cable between the circuit boards To better understand the implementation of the preferred embodiment of the present invention, consider two pairs of digital electronics boards which are to be interconnected. Operation of the invention entails assigning an electrical condition, such as a constant voltage, to a "dedicated" subsocket on a board at one end of the cable. As long as the cable is properly connected, this assigned electrical condition will be properly received by another dedicated subsocket and associated error-detect circuitry on the board at the receiving end. If, however, the cable is improperly connected in any way, the assigned electrical condition is not received at the dedicated subsocket at the receiving end, and an error be indicated by the error-detect circuitry.

In accordance with the present invention, each board's socket typically has at least one "dedicated" subsocket (i.e. a subunit of the socket) which is connected to one line of the multi-line cable and which is used exclusively for error detection. In addition to these dedicated subsockets, the invention typically use a number of "semi-dedicated" subsockets. These are used for uni-directional data transfer, and are located so that, in the event of any cabling error, they will facilitate detection of the error. During proper connection, each socket on one of the aforementioned boards typically has one dedicated subsocket which is connected to circuitry on the board and which transmits, via multi-line ribbon cable, a constant electrical signal to a dedicated subsocket with dedicated signal detection circuitry on the other board.. Thus, should this constant signal not be received by the dedicated signal detect circuitry, an error is detected.

In accordance with further features of the present invention the means for establishing a predetermined proper cable connection signal may comprise a transmit circuit connected to a preselected one of the connector members of the first circuit board connector means. Similarly, the means for receiving may comprise an error detect circuit connected to a corresponding numbered connector member of the second circuit board connector means. In addition, to implement the detection scheme of the present invention it is preferred to have other connector members as semi dedicated connector members which permit only unidirectional signal transmission so that there is not a signal maintained to prevent an error signal when in fact the error signal should be generated. In this regard there is a receive only circuit means connected to another one of the connector members of the first circuit board connector means and there is also a transmit only circuit means connected to said another one of the connector members of the second circuit board connector means. The positions of the preselected and another of the connector members are arranged so that when the cable is misconnected the receive only circuit means is connected to the error detect circuit to register an error signal thereat.

When two cables are to be employed, as described in specific embodiments hereinafter, then there is an error detect circuit associated with each of the cables and at the other end of the cable also a corresponding transmit circuit for establishing a predetermined signal to be sensed at the error detect circuit. The detection circuits in this embodiment are connected to different ones of the connector members of the particular connector means so as to avoid the possibility of not detecting a particular misconnection.

To accomplish the foregoing and other objects, features and advantages of the invention there is now provided a detailed description taken in conjunction with the accompanying drawings, in which:

FIG. 1 shows a schematic representation of 10 subsocket socket W, comprising subsockets 1-10, on board A, properly connected to socket X, comprising subsockets 1-10, on board B via lines a-j of 10-line ribbon cable 100. FIG. 1 also depicts error detecting circuitry.

FIG. 3 is a cutaway view showing an improper connection between sockets W and X in which the interconnecting cable is twisted one-half turn, causing subsockets 1-10 on W to be improperly connected to subsockets 10-1 on X, respectively. FIG. 3 also associated circuitry.

FIG. 4 is a cutaway view showing a failed connection between sockets W and X in which continuity has been lost between sockets W and X. FIG. 4 also depicts associated circuitry, as in FIG. 3.

Figure 5:
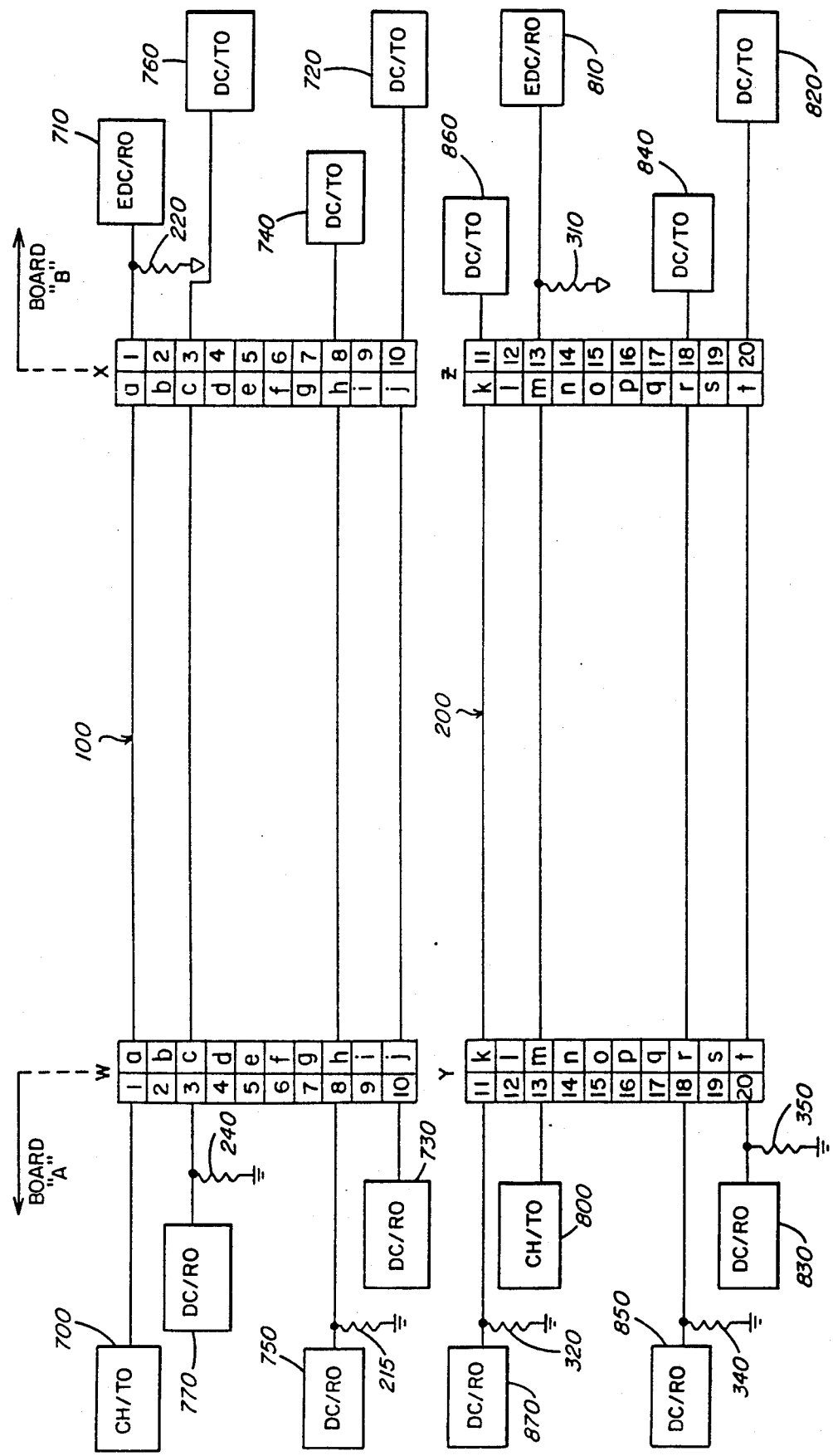

FIG. 5 a schematic diagram of two 10-pin sockets W and Y, located on board A, each properly connected via 10 pin cables 100 and 200 to corresponding sockets X and Z, respectively, located on board B. Subsockets 1-10 of socket W correspond to subsockets 1-10 on socket X and are intended to be connected thereto by lines a-j, respectively. FIG. 5 also depicts associated circuitry.

Figure 6:
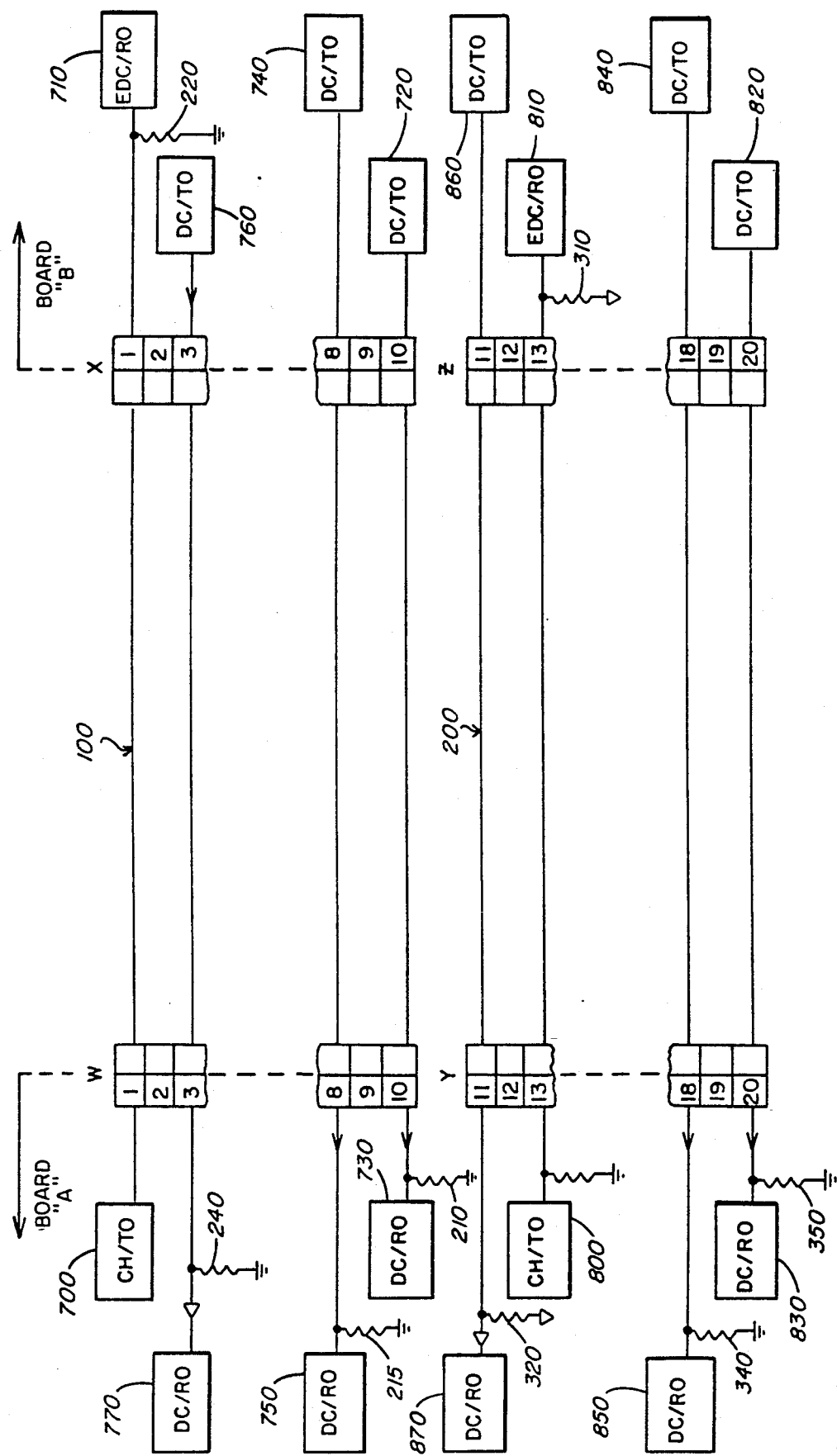

FIG. 6 is a cutaway schematic showing two 10-pin sockets W and Y, located on board A, each properly connected via 10-pin cable to corresponding sockets X and Z, respectively, located on board B. FIG. 6 also depicts associated circuitry.

Figure 6A:
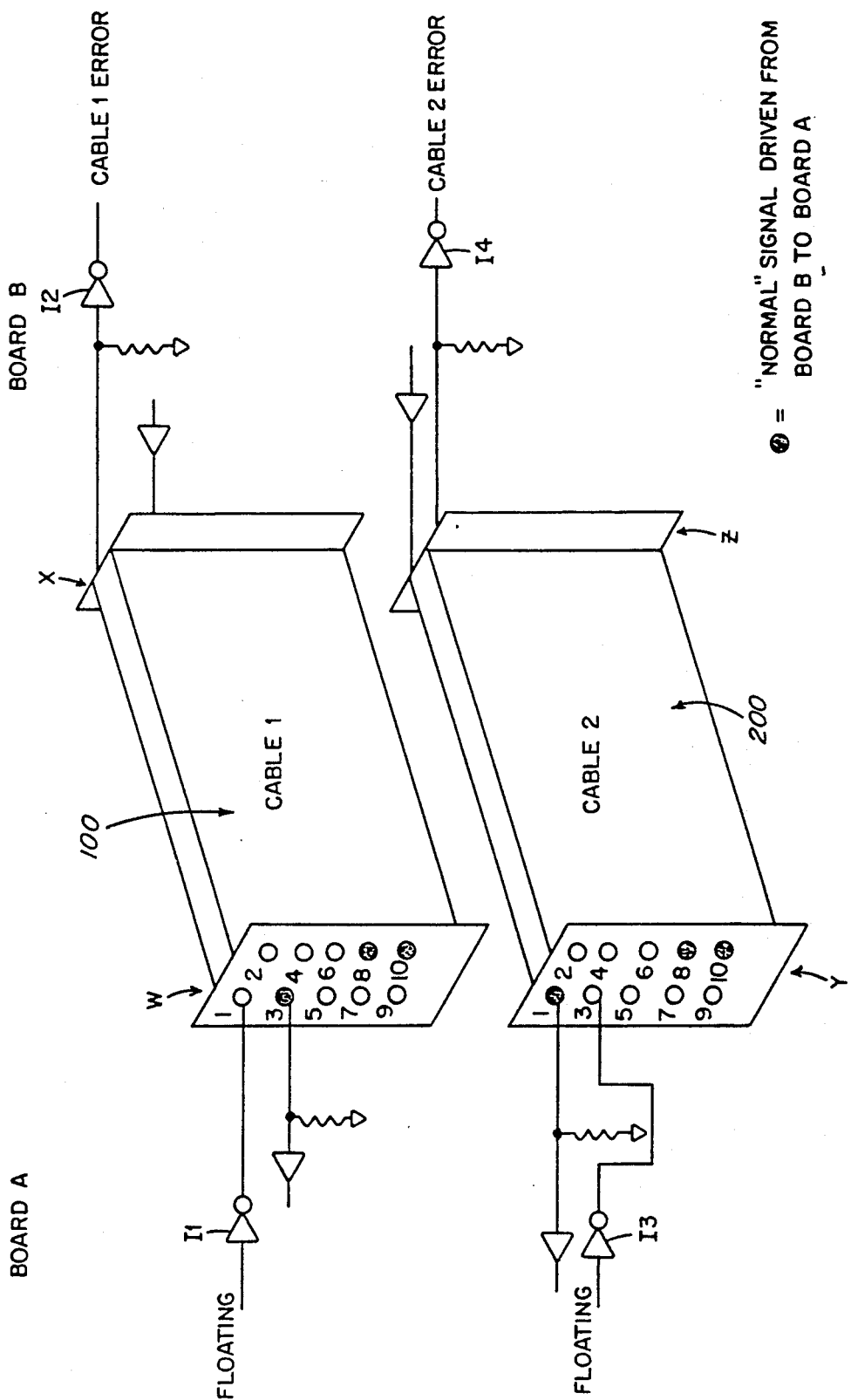

FIG. 6A is a schematic block diagram of a two cable system showing further circuit details of the transmit and receive circuits that may be employed in one version of the invention.

Figure 7:
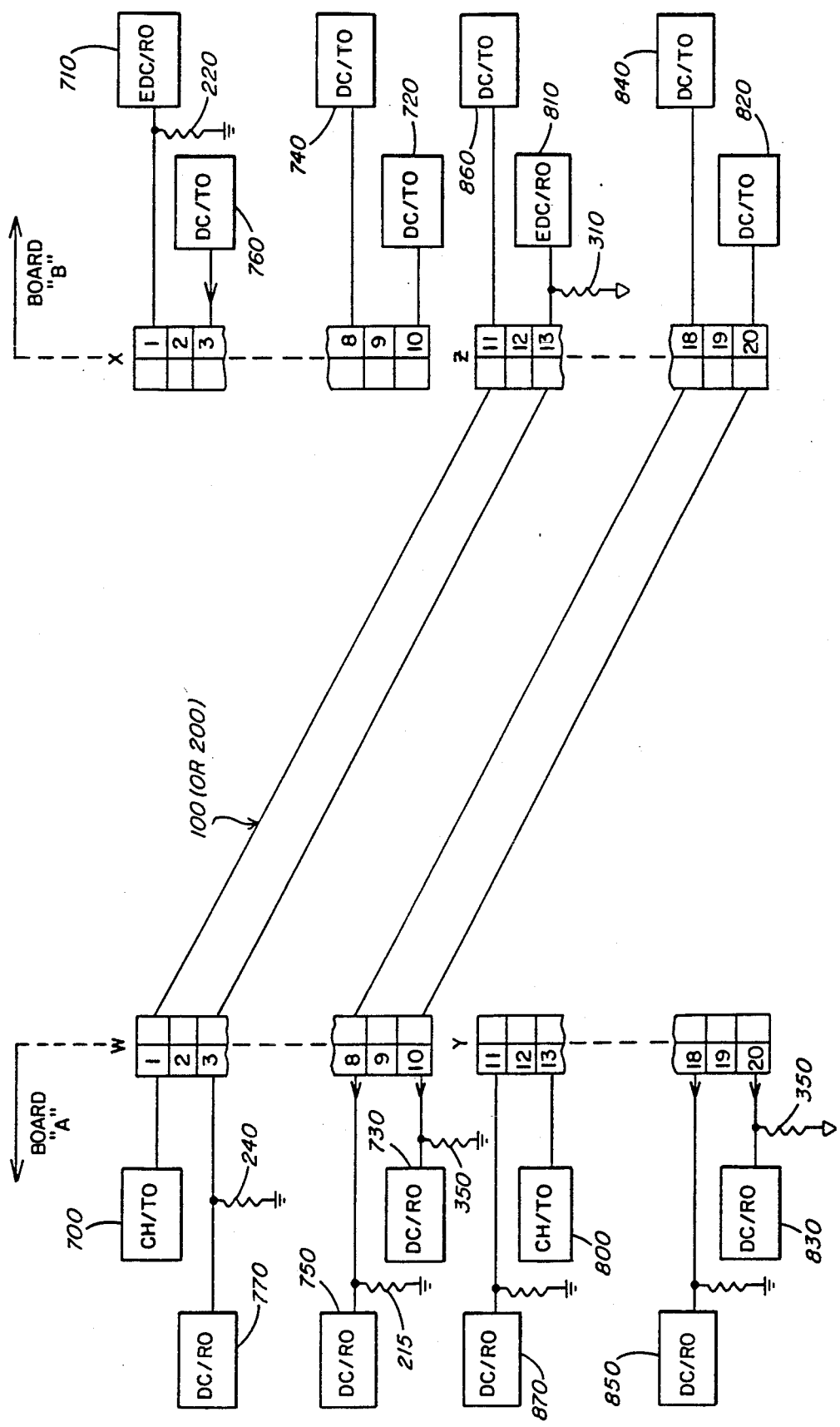

FIG. 7 is a cutaway view of the sockets of FIG. 5. It depicts a misplugging error in which a cable plugged into socket W, and intended for connecting socket W on board A to socket X on board B, is misplugged so that it instead connects socket Z to socket W, resulting in an undesired correspondence between subsocket W1 and subsocket Z11, subsocket W2 and subsocket Z12, etc. FIG. 7 also depicts circuitry as in FIG. 5. FIG. 7 also depicts the receive-only and transmit-only data circuits depicted in FIG. 5.

Figure 8:
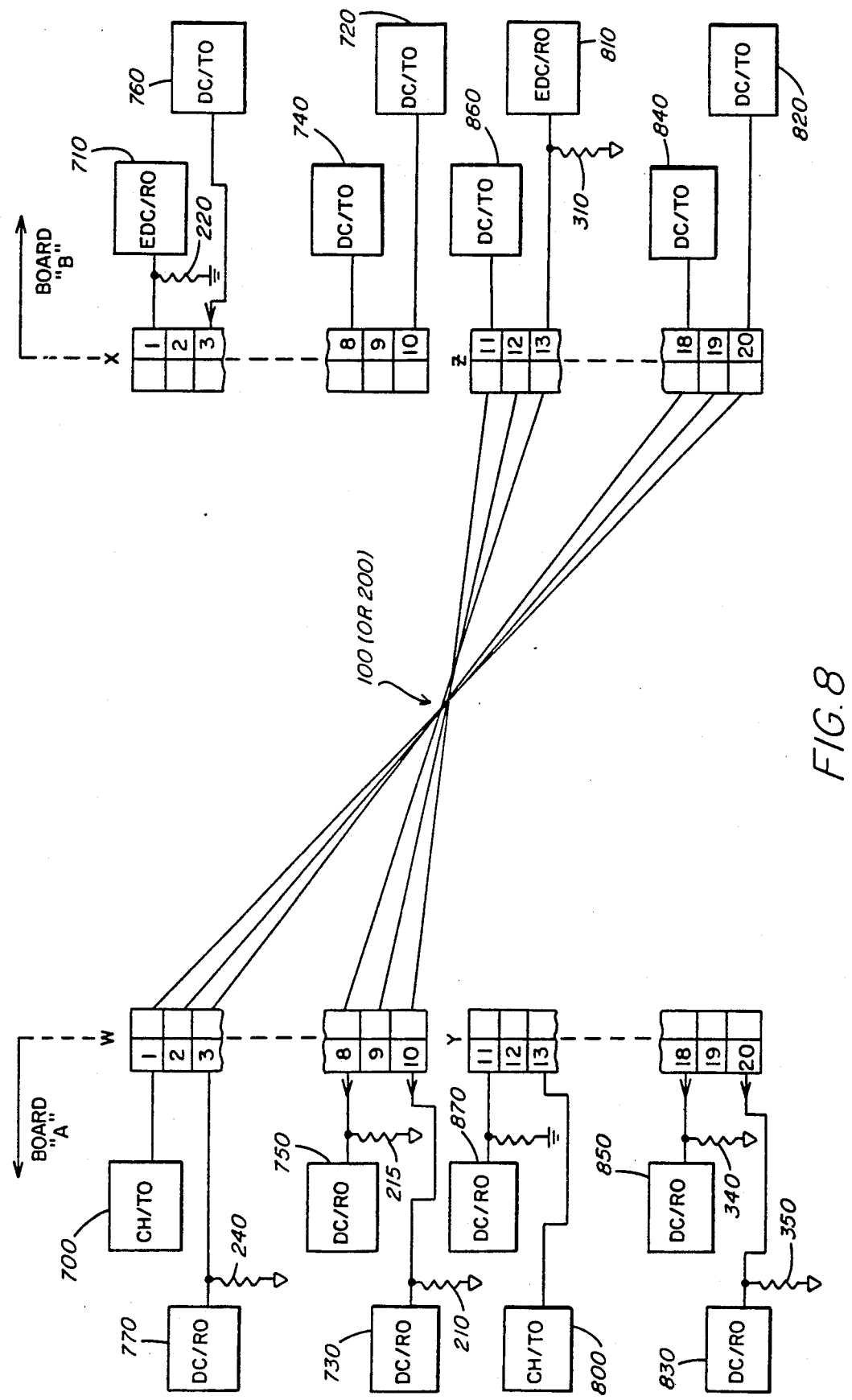

FIG. 8 is a cutaway view of the sockets of FIG. 5. It depicts the misplugged situation of FIG. 7 with an added twist; i.e. a cable is misplugged and twisted one-half turn, resulting in an undesired correspondence between subsocket W1 and subsocket Z20, subsocket W2 and subsocket Z19, etc. FIG. 8 also depicts circuitry.

Figure 9:
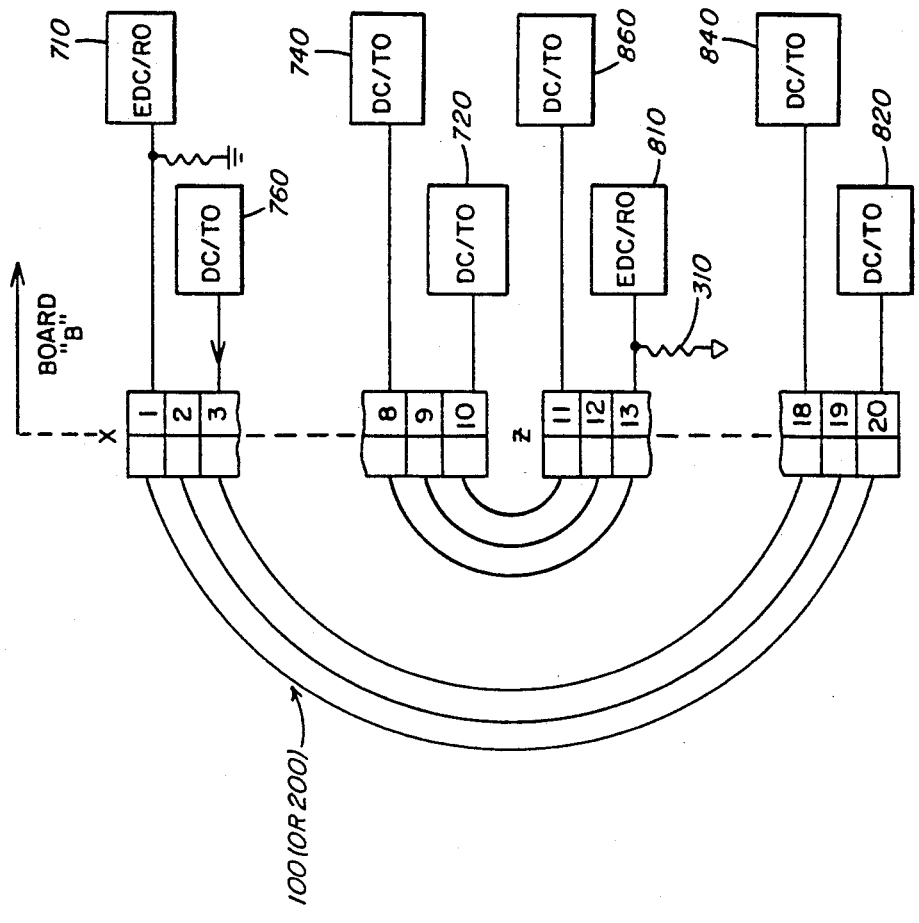
Figure 9:
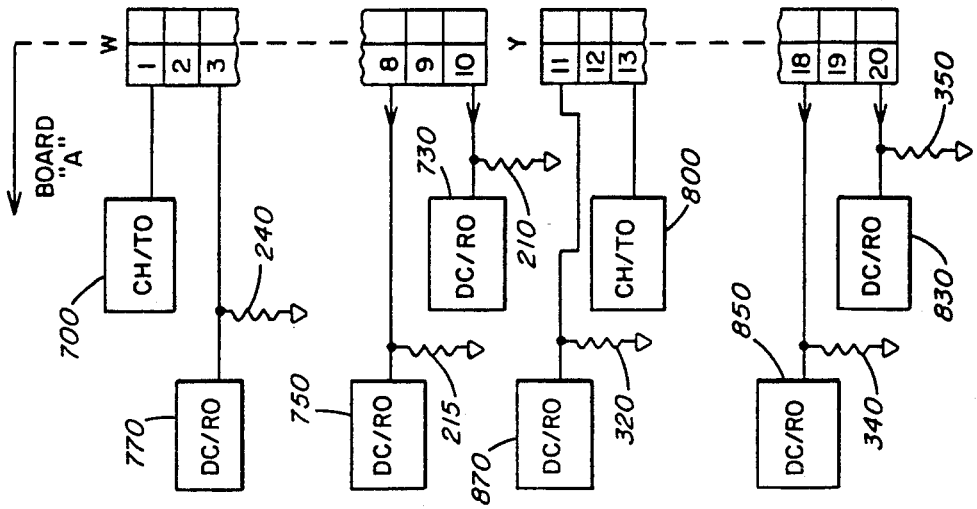

FIG. 9 depicts in cutaway view a reversed, misplugged cable error in which the cable intended to connect socket X on board B to socket W on board A instead erroneously connects socket X on board B to socket Z on board B such that subsocket X1 is connected to subsocket Z20, subsocket X2 is connected to subsocket Z19, FIG. 9 also depicts associated circuitry.

Figure 10:
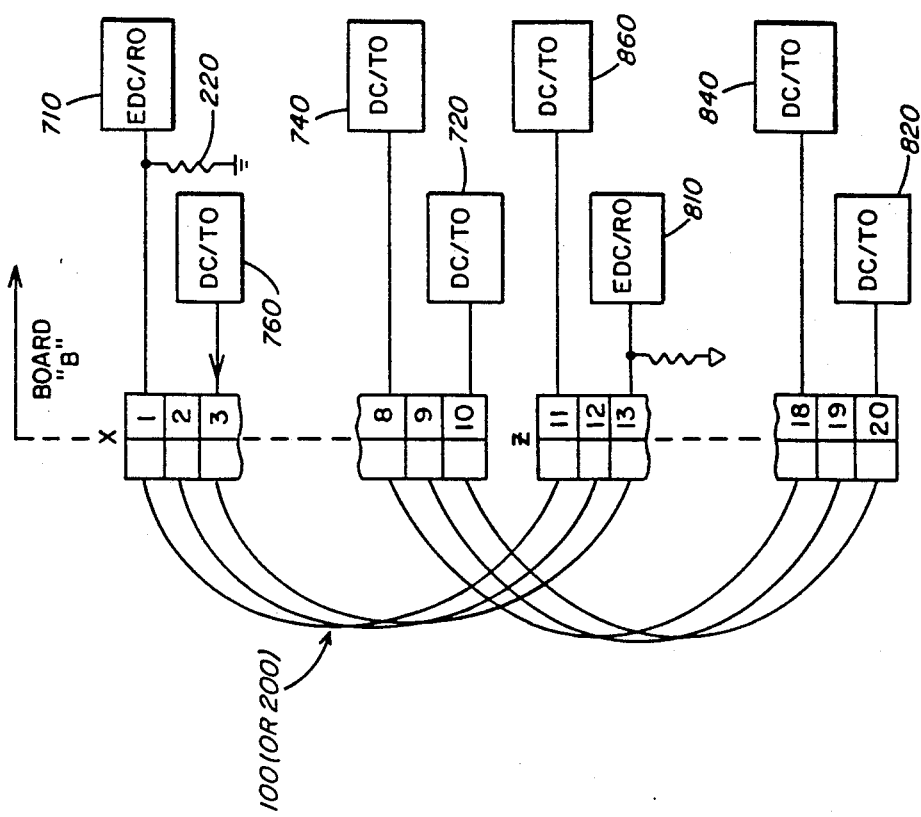
Figure 10:
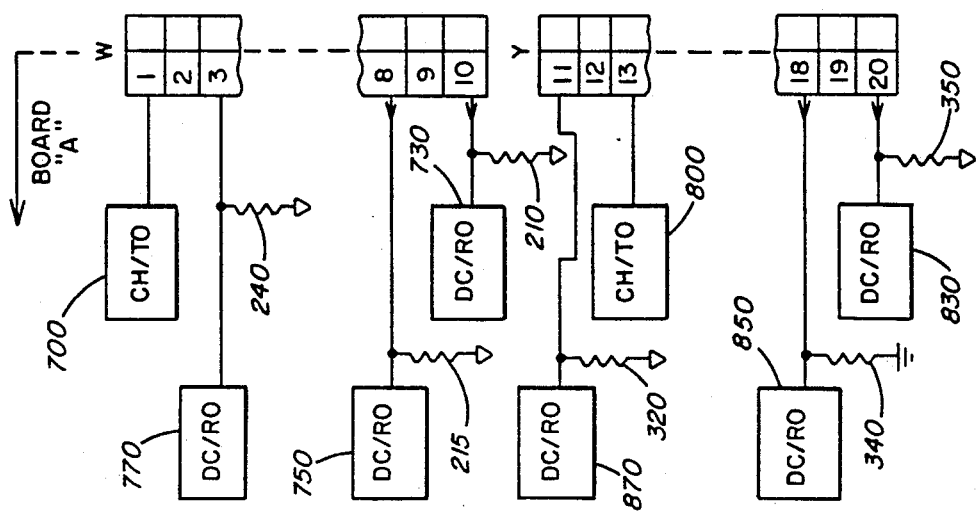

FIG. 10 depicts in cutaway view a reversed, misplugged, twisted cable error in which a cable intended to connect socket X on board B to socket W on board A was instead erroneously reversed, twisted one-half turn and misplugged so as to connect sockets X and Z on board B such that subsocket X1 corresponds on to subsocket Z11, subsocket X2 is connected to subsocket Z12, etc. FIG. 10 also depicts associated circuitry.

DETAILED DESCRIPTION

In the drawings herein, there are now disclosed several different cable diagrams illustrating both the proper connection of cables as well as a number of different misconnections of cables In each of these diagrams the related boards are shown schematically with each of these boards considered as having associated therewith connectors identified herein as sockets. Each of the cables are also shown schematically as interconnecting between the connectors of respective boards, By way of example, the cable itself may be a male-to male multi line ribbon cable that terminates in male pins. Furthermore, the connectors on the boards may be corresponding female sockets which comprise a number of female subsockets, each subsocket being capable of receiving one pin. However, it will be readily recognized by those skilled in the art that the invention could be implemented using almost any type of cable connector, regardless of "gender," as well as by non-cable connectors such as edge card connectors. Further, for the purposes of this application, references to logic highs and lows are given merely as examples, and those familiar with the art of digital electronics will recognize that, with only minor changes, reverse logic assignments may be made and yet identical circuit results achieved.

To better understand the implementation of the preferred embodiment of the present invention, consider two pairs of digital electronics boards which are to be interconnected. Operation of the invention entails assigning an electrical condition, such as a constant voltage, to a "dedicated" subsocket on a board at one end of the cable. As long as the cable is properly connected, this assigned electrical condition will be properly received by another dedicated subsocket and associated error detect circuitry on the board at the receiving end. If, however, the cable is improperly connected in any way, the assigned electrical condition is not received at the dedicated subsocket at the receiving end, and an error is indicated by the error-detect circuitry.

In accordance with the present invention, each board's socket typically has at least one "dedicated" subsocket (i.e. a subunit of the socket) which is connected to one line of the multi line cable and which is used exclusively for error detection. In addition to these dedicated subsockets, the invention typically use a number of "semi dedicated" subsockets. These are used for uni directional data transfer, and are located so that, in the event of any cabling error, they will facilitate detection of the error. During proper connection, each socket on one of the aforementioned boards typically has one dedicated subsocket which is connected to circuitry on the board and which transmits, via multi line ribbon cable, a constant electrical signal to a dedicated subsocket with dedicated signal detection circuitry on the other board. Thus, should this constant signal not be received by the dedicated signal detect circuitry, an error is detected.

Figure 1:
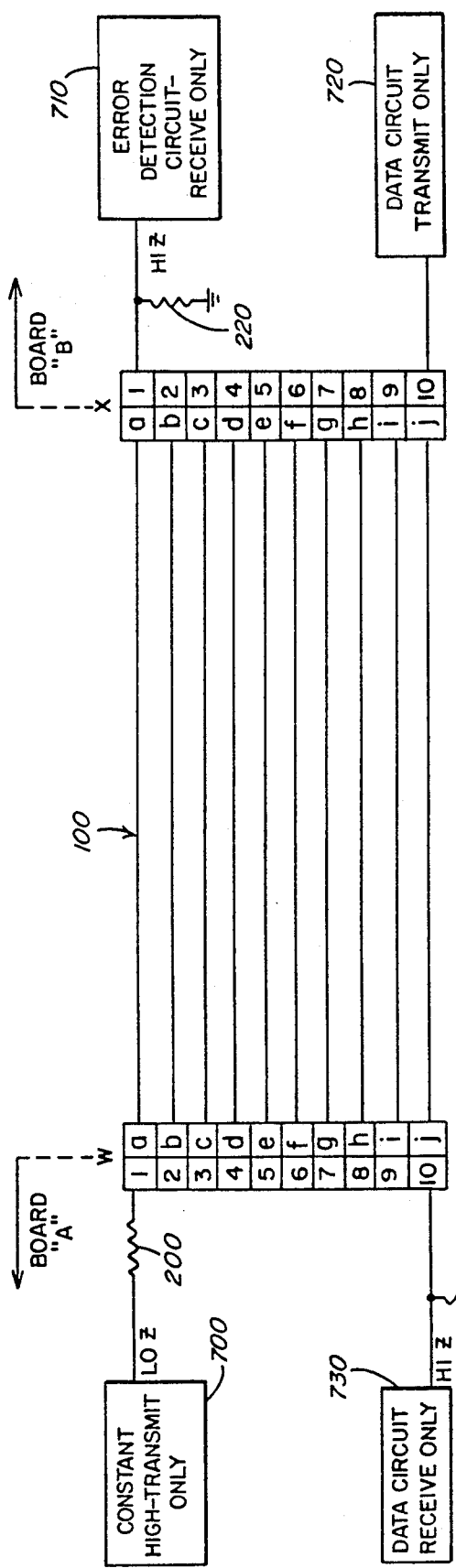

Reference is now made to FIG. 1 of the drawings in which proper cable connection between two sockets, W and X, of respective boards A and B, is shown. This figure depicts how a properly installed cable should look in an application of the invention to only two adjacent boards. Subsockets 1-10 on socket W correspond to subsockets 1-10 on socket X and are interconnected by lines a-j, respectively of cable 100. FIG. 1 also shows receive-only error-detect circuit 710, which is capable of only receiving signals (whether data, code, or simply a constant voltage) and constant-high/transmit-only circuitry 700, which is used only to transmit say a constant signal to error-detect circuit 710.

It is noted that circuits 700 and 710 are connected to opposing dedicated subsockets which are not used for data transfer, namely subsocket 1 on each board. It is further noted that circuit 71g which is shown connected to the node at one end of resistor 220, might also simply be a node, i.e., the state of the node itself might indicate whether an error has been detected. FIG. 1 also shows transmit only data circuit 720, which is used exclusively to transmit-data (i.e. logic highs and lows) and receive-only data circuit 730, which is used exclusively to receive data.

FIG. 1 also depicts an embodiment of the invention employing resistors. Note that, under proper connection, low-impedance resistor 200 and high impedance resistor 220 function together as a voltage divider such that most of the voltage from circuit 700 falls across resistor 220, and so a "high" is detected at error detection circuit 710. Note that were the cable to be twisted, as in FIG. 3, subsocket X1 would be mistakenly connected to subsocket W10, and so resistor 220 would be connected via line "j" to pull down resistor 210. This will pull down the voltage input to error-detect circuit 710, and so the twisted cable error would be detected as a logic low. (It is to be noted that all other cable errors could also be detected using the apparatus of this embodiment, and while hereinafter all examples of error detection will be made using other embodiments of the present invention, one skilled in the art will readily recognize that the embodiment depicted in FIG. 1 would also work.)

Figure 2:
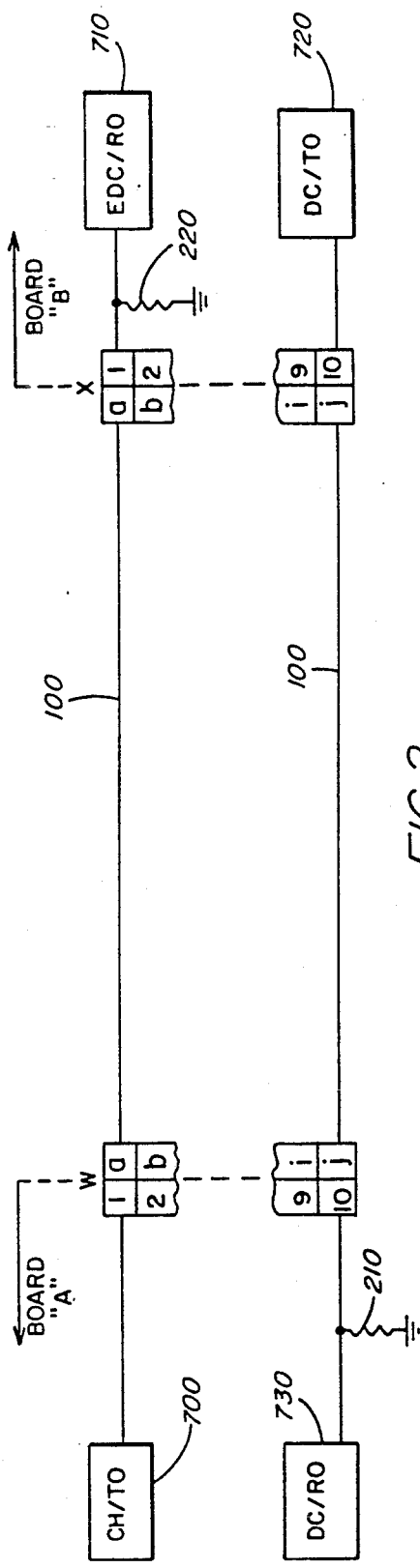
FIG. 2 shows a cutaway view of FIG. 1 showing proper connection as in FIG. 1, along with another embodiment of associated circuitry.

FIG. 2, a cutaway view of FIG. 1, shows another embodiment of the error-detect circuit apparatus in connection with the present invention. Semi-dedicated subsocket X10 drives a data stream of logic highs and lows from transmit only data circuitry 720 to semi-dedicated subsocket W10 and receive-only data circuit 730 connected thereto. No transmitting circuitry exists at W10. The circuitry is arranged in this manner so that for an incorrect connection, as will be described in further detail hereinafter, one does not want to receive signals transmitted from another board that could be interpreted as proper signals when in fact they are not.

In the apparatus of FIG. 2, if a logic high is propagated from the constant high, transmit-only circuit 700 connected to subsocket W1 and via line "a" to subsocket X1, this results in a logic high being output to subsocket X1. This "high" is seen by receive-only error-detect circuit 710 connected thereto as an indicator of normal operation. The "high" signal may be read and/or processed by various means including, but not limited to, indicator lamps, microprocessors, gates, etc.

To verify proper cable connection, constant, high transmit-only circuit 700 at subsocket W1 can be connected so as to supply a constant logic "high" to subsocket X1 and to receive-only error detection circuit 710 connected thereto. As shown in FIG. 1, the other subsocket assignments are made so that, no matter which cabling errors may be committed by the operator, none will result in a high, constant or otherwise, being supplied to subsocket Xl, or else the circuit error detect circuit will mistakenly indicate proper cable connection. As will be seen, the other subsocket assignments have in fact been made to prevent that.

In the previous discussion relating to FIGS. 1 and 2, there has been described a transmit circuit 700 and a receive circuit 710. These circuits are also described in further of the embodiments disclosed herein in connection with the illustration of a number of different misconnections of cables. As far as a particular embodiment of these circuits is concerned, and as has been described, the circuit 700 may simply output a constant "high" voltage. For this purpose there may be provided an inverter as part of the circuit 700. This inverter may be left floating while driving the line from one board. On the other hand, at the termination end on the other board there is the noted resistor as well as a further inverter comprising at least part of the receive circuit 710.

If either end of the cable is unplugged, as will be described in further detail herein in connection with FIG. 4, the line is pulled down at the receiving end, forcing a "high" at the output of the receive inverter, thus indicating an error.

Figure 2A:
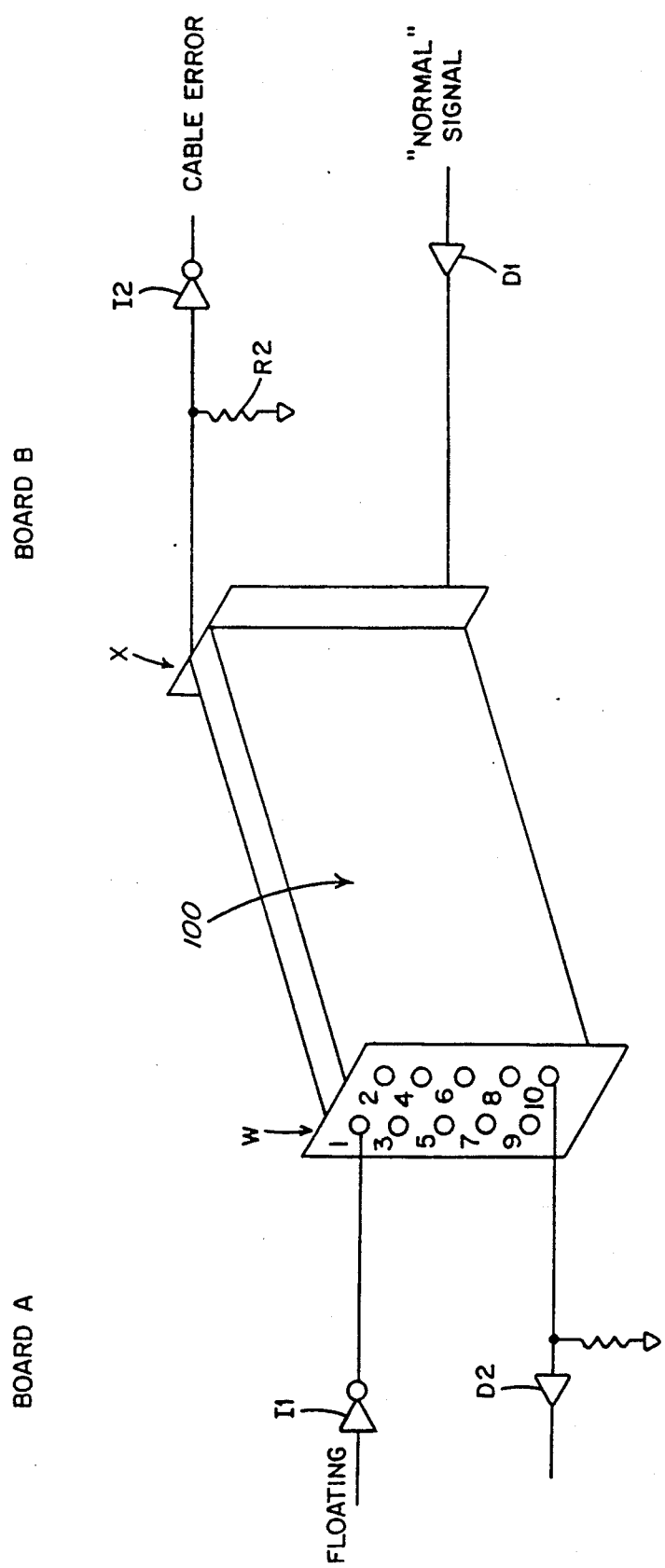
FIG. 2A is a circuit block diagram showing a single cable version with further details of the transmit and receive circuits.

Now, with regard to the inverter embodiment just described for transmit and receive of signals, refer to FIG. 2A herein. On board A there is the inverter I1 and in board B is the inverter 12. FIG. 2A also shows actual circuitry that can implement the circuits 720 and 730. This includes the respective buffers or drivers D1 and D2 illustrated in FIG. 2A.

Reference is now made to FIG. 3, which illustrates the connections involved in a twisted cable error. FIG. 3 also depicts the embodiment of associated error detect circuitry which was depicted in FIG. 2. Note in FIG. 3 that subsocket X1, and the associated error-detect circuit 710 connected thereto, is no longer supplied with the expected logic "high " In fact, subsocket X1 of board B is now connected to subsocket W10, and receive-only data circuit 730 and pull down resistor 210 connected thereto. Pull-down resistor 210, in parallel with pull-down resistor 220 connected at subsocket X1, supplies a logic low to error-detect circuit 710, thus indicating an error, in this case a single cable twisted cable error.

In FIG. 3 it is noted that the circuit 730 connected to subsocket W10 is selected to be of the "receive-only" type, so that in the event of a twisted cable error, no "high" (or any other appropriately selected signal) could be transmitted to error-detect circuit 710 and thereby cause error detect circuitry 710 to falsely indicate proper connection.

FIG. 4 illustrates another type of cabling error which may be made with a single cable: the unplugged cable error. Note that subsocket X1, and the error-detect circuitry 710 connected thereto, has its input open. This results in a logic "low" (ground voltage through resistor 220) being sensed at error-detect circuit 710, thus indicating the single unplugged cable error.

Reference is now made to FIG. 5, which depicts proper interconnection between two adjacent pairs of subsockets. W and Y, on board A and subsockets X and Z, on board B. Subsockets 1-10 of socket W correspond to subsockets 1-10 of socket X and are intended to be connected thereto by lines a-j, respectively, of cable 100. Subsockets 11-20 of socket Y are connected to subsockets 11-20 of socket Z and are intended to be connected thereto by lines k-t of 10-pin cable 200.

FIG. 5 also shows receive only error detect circuits 710 and 810, connected to transmit-only constant-high circuits 700 and 800, respectively. FIG. 5 also shows transmit-only data circuits 720, 740, 760, 820, 840 and 860, the significance of which will be explained below. Further, FIG. 5 also depicts receive only data circuits 730, 750, 770, 830, 850 and 870; the importance of all of which will be explained below.

Note from FIG. 5 that practicing the invention for two adjacent pairs of sockets typically requires one dedicated and three semi-dedicated subsockets per socket. As will be seen, the total number of cables which can be fully protected is usually limited by the total number of subsockets in each socket connected to the cable. This is because, ideally, the dedicated subsocket should be in a different position on each pair of sockets that is to be protected. If it is not, then switching two cables which are each connected to sockets having the same dedicated subsocket would mistakenly give no error-detect.

However, if the number of cables to be protected is necessarily greater than the number of subsockets connected to each cable, it is necessary to have different cables use the same dedicated subsocket. In this instance there arises a danger of failing to detect an error. If one has to protect a greater number of cables than there are available subsockets in each socket, than the two sockets which have the same dedicated subsocket are spaced apart a greater distance than the length of any cable provided with the system. Thus, connecting these two subsockets cannot occur, and cabling errors are averted.

As in FIG. 1, in FIG. 5, subsocket W1 drives a logic "high" signal from circuit 700 down line "a" into subsocket X1 and the error-detect circuit 710 connected thereto. Similarly, subsocket Y13 drives a logic high signal from transmit circuit 80 via line "m" into subsocket Z13 and pull-down resistor 310 and error-detect circuit 810 connected thereto. Note that circuits 730, 750, 770, 830, 850, and 870 are all placed so that, in the event of any type of cabling error, none will supply the continuous high (or any other signal, "high" or "low") of circuits 700 and 800 and thereby falsely cause the error detect circuitry to indicate proper connection. In fact, all of the dedicated and semi-dedicated subsockets and connected circuitry are positioned so that, no matter which cabling errors are committed, none result in a continuous "high" being supplied to subsocket X1 and error detect circuit 710 or to subsocket Z13 and error detect circuit 810. Only proper connection will result in a continuous "high" being so supplied.

When the present invention is practiced with two cables, detection of the cable errors associated with a single cable occurs as previously explained. Errors associated with a plurality of cables, such as reversed plugging or misplugging errors, may also be detected by the present invention. For examples, refer to FIGS. 6 and 7.

FIG. 6 depicts a cutaway view of FIG. 5 showing the subsockets and lines used in connection with the present invention. (Subsockets which are not semi-dedicated may be used for ordinary bi-directional data transfer.) FIG. 6 also shows associated error detect circuitry as in FIG. 5. FIG. 6 also depicts the receive-only and transmit-only circuitry depicted in FIG. 5.

Reference is now also made to FIG. 6A for an illustration of somewhat more detailed circuitry. Particularly as it relates to the two cable embodiment illustrated in FIG. 6. This arrangement, illustrated in FIG. 6A, is similar to that previously described in connection with FIG. 2A. Note that there is shown both the cable 100 and the cable 200 as well as all the sockets W, X, Y and Z. FIG. 6A shows the inverter I1 and the inverter 12 previously described in FIG. 2A. Also, associated with cable 200 are inverters 13 and 14. Inverter 13 is the constant "high" transmit circuit and inverter 14 functions as the error detect circuit. Note in FIG. 6A the first and second cable error output signals.

Now, in FIG. 6A the cable detects the signal assigned to line 1 of cable 100 and line 3 for cable 200. In this situation, the cables could be switched at one end and reversed. For the former case to be detected, line 1 of cable 200 and line 3 of cable 100 are assigned to be driven from board B to board A during normal operation as indicated in FIG. 6A. For the switched and reversed case, it is required that line 10 of cable 200 and line 8 of cable 100 be assigned in the same way. Thus, all possible cable errors can be detected by this scheme.

Reference is now made to FIG. 7, which depicts a two-cable misplugging error in which the cable, which had been intended to connect socket W to socket X, was instead misplugged from socket W into socket Z. Note that subsocket X1 and the error-detect circuit 710 connected thereto does not receive the "high" it would have under proper connection, because the misplugging error has left its input open, thereby providing a logic "low", and so an error is indicated by error-detect circuit 710. Note further that subsocket Z13 and error-detect circuit 810 connected thereto does not receive the continuous "high" it would have under proper connection. In fact, subsocket Z13 will not receive any signal, "high" or "low", as the misplugging has left it connected to socket W3's pull down resistor 240 and receive-only data circuit 770, and so an error is indicated by error-detect circuit 810. Thus, a misplugging error is indicated at both sockets X and Z.

With further reference to FIG. 7, it is also noted that if an additional cable is connected from socket Y to socket X this will furthermore maintain the cable connection error mode. In that instance, subsocket Y11 is connected to subsocket X1 and there are in essence only "receive-only" circuits connected thereto essentially having resistors connected in parallel in maintaining a "low" at the error detector circuit 710.

Reference is now made to FIG. 8, which depicts a twisted, misplugged cable error. Note here that subsocket X1, which has been left open, effectively receives a low at its input, and so error-detect circuit 710 indicates an error. Similarly, subsocket Z13 and error-detect circuit 810 connected thereto, which had, under proper connection, received from circuit 800 a continuous high, instead is improperly connected to subsocket W8, which, being connected to receive-only data circuit 750, has no driving circuitry capable of sending any signal, including a "high." Therefore, subsocket Z13 is left connected only to circuit 750 and pull-down resistor 215. Error-detect circuit 810 therefore receives a logic "low", thus indicating an error. FIG. 8 also depicts the error-detect circuitry and receive-only and transmit-only data circuitry as in FIG. 5.

In the cable error connection of FIG. 8, it is noted that if a cable is also connected from socket Y to socket X there will be a further maintenance of error detection. In that instance, the error detect circuit 710, whether connected by way of cable to subsocket Y11 or Y20, there is no transmit circuit at the socket Y side and thus a "low" is found at the input 1 the receive circuit 710. This indicates an error. It is furthermore noted that this is indicated whether the cables are connected directly or twisted.

Reference is now made to FIG. 9, which depicts a reversed, misplugged error in which socket X, which was to have been connected to socket W, was instead connected to socket Z via a misplugged cable. Subsocket X1 and error detect circuitry 710, which during proper connection had received a continuous "high" from transmit-only constant "high" circuit 700, now is connected to transmit-only data circuit 820 located at subsocket Z20. While no error will be detected as long as "highs" are being transmitted from transmit only data circuit 820, as soon as a "low" (which occurs at some point in the data stream) is transmitted an error will be detected. While this cabling error, unlike the others, is not detected instantaneously, it is detected within a fraction of a second.

Additionally, note in FIG. 9 that subsocket Z13 is improperly connected to subsocket X8. As with subsocket X1, an error will be detected at error-detection circuit 810 at subsocket Z13 as soon as the transmit-only data circuit at subsocket X8 sends a "low"—most likely within a fraction of a second. Thus, errors and detected at both sockets on board B should a cable be misplugged between them. Should a cable be misplugged between sockets on board A, errors would also be indicated, as sockets X and Z would be left open. FIG. 9 also depicts the error-detect circuitry and receive-only and transmit-only data circuitry as in FIG. 5.

Reference is now made to FIG. 10, which depicts a reversed, misplugged, twisted cable error. Note in FIG. 10 that error-detect circuit 710 at subsocket X1 is improperly connected to the transmit-only data circuit 860 at subsocket Z11 and that subsocket Z13 and the error-detect circuit 810 connected thereto is improperly connected to subsocket X3 and transmit-only data circuit 760. As before, as soon as a "low" signal from the data stream leaving transmit-only data circuits 760 or 860 reaches either of the error-detect circuits 810 or 710, respectively, an error is detected at that socket. FIG. 10 also depicts the error-detect circuitry and receive-only and transmit-only circuitry as in FIG. 5.

Thus, it is seen that the method and apparatus of the present invention will indicate a wide variety of cable errors. Further, it does so without requiring the expensive, additional hardware or valuable processing time of the computer.

There has been described herein, certain versions of the detection circuit as well as the error signal transmission circuit. Described herein is an arrangement in which a "high" level signal is used, being maintained at a continuous logic level so as to maintain a correct cable connection status indication. In accordance with the invention several other techniques can also be employed such as a particular form of coding. For example, a particle code could be set up such as a binary code and this could be detected at the other cable end to determine a proper connection. Any incorrect code received would then be indicative of an error in cable connection.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. An apparatus for detecting improper external connection of at least a first cable having multiple lines and constructed and arranged for connection between respective first connector means for separately disposed first and second circuit boards, in which each of the first connector means has a plurality of connector members corresponding to the number of first cable lines, said apparatus comprising;

means for establishing a first predetermined electrical signal connected to the first circuit board connector means and establishing on one of the first cable lines said first predetermined electrical signal identifiable as a first correct cable connection signal, wherein said means for establishing comprises a first signal generator connected to a preselected first connector member of said first circuit board first connector means;

first generating means connected to the second circuit board first connector means and connected for receiving from said one first cable line, said first predetermined electrical signal in the event of proper connection between said first circuit board first connector means and said second circuit board first connector means, said first generating means for generating a first error signal in the absence of said first predetermined electrical signal, wherein said first generating means comprises a first error detect circuit connected to a second connector member, said second connector member having a position on said second circuit board first connector means corresponding to the position of said first connector member on the first connector means of said first circuit board, said second connector member corresponding in the event of proper connection to the one first cable line to which the first predetermined electrical signal is applied by said establishing means;

first sensing means, connected to a third connector member of the first circuit board first connector means constructed and arranged for only receiving signals and for sensing any signal from said third connector member, whereby a connection between said first generating means and said first sensing means causes said first error detect circuit to indicate improper cable connection; and a second signal generator connected to a fourth connector member, said fourth connector member having a position on the second circuit board first connector means corresponding to the position of said third connector member on said first circuit board first connector means, whereby the successful reception of said first predetermined electrical signal from said means for establishing by said first generating means indicates proper connection of said first cable between the first and second circuit boards; and whereby a failure to receive said first predetermined electrical signal indicates improper connection of said first cable between the first and second circuit boards.

2. An apparatus as set forth in claim 1 wherein the positions of the preselected first connector member and the third connector member are arranged on the first circuit board first connector means, and the positions of the second connector member and the fourth connector member are arranged on the second circuit board first connector means, so that if the cable is misconnected then said first sensing means is connected to said error detect circuit, whereby the first error signal can be generated and provision of a false indication of proper connection to said first generating means is avoided.

3. An apparatus as set forth in claim 1 wherein said first signal generator includes means for generating a predetermined continuous voltage level.

4. An apparatus as set forth in claim 1, further comprising:

indicating means, receiving the error signal, for indicating improper connection of said cable between said first and second circuit boards if the first error signal is present.

5. An apparatus as set forth in claim 1 wherein
said error detect circuit is connected to a grounded impedance;
said receive only circuit means is connected to a grounded impedance; and
the positions of the preselected connector member and the another connector member are arranged so that if the cable is misconnected then the receive only circuit means is connected to the error detect circuit, whereby the first error signal is generated.

6. An apparatus as set forth in claim 1 wherein
said error detect circuit is connected to an electrical potential;
said receive only circuit means is connected to similar electrical potential; and
the positions of the preselected connector member and the another connector member are arranged so that if the cable is misconnected then the receive only circuit means is connected to the error detect circuit, whereby the first error signal is generated.

7. An apparatus as set forth in claim 2 wherein the at least first cable comprises first and second cables and wherein each of said first and second circuit boards are each further provided with second connector means respectively for the second cable, wherein each of the second connector means has a plurality of connector members corresponding to the number of second cable lines, and wherein the apparatus further comprises:

means associated with said second connector means of said first circuit board for establishing a second predetermined electrical signal identifiable as a correct cable connection signal and including a third signal generator connected to a preselected fifth connector member of said second connector means of said first circuit board.

8. An apparatus as set forth in claim 7 wherein the preselected fifth connector member of said second connector means of said first circuit board has a relative position, in said second connector means of said first circuit board, different from the relative position of the preselected first connector member of said first connector means of said first circuit board.

9. An apparatus as set forth in claim 8 further including second generating means associated with the second circuit board second connector means and connected for receiving said second predetermined electrical signal in the event of proper connection of the second cable between said first circuit board second connector means and said second circuit board second connector means, said second generating means for generating a second error signal in the absence of said second predetermined electrical signal and including a second error detect circuit connected to a sixth connector member of the second circuit board second connector means corresponding in relative position to the preselected fifth connector member of said second connector means of said first circuit board.

10. An apparatus as set forth in claim 9 wherein the first and second error detect circuits are connected to different lines of the cable.

11. An apparatus as set forth in claim 10 including second sensing means, connected to a seventh connector member of the first circuit board second connector means and capable of only receiving signals, for sensing any signal from, but not transmitting any signal to, said seventh connector member, whereby a connection between said second sensing means and said first or second generating means provides a further indication of improper cable connection.

12. An apparatus as set forth in claim 11 including a fourth signal generator connected an eighth connector member of the second circuit board second connector means.

13. An apparatus as set forth in claim 3 wherein said means for receiving said predetermined electrical signal includes means for sensing said continuous voltage level, and, in the absence thereof, generating the error signal.

14. An apparatus as set forth in claim 13 wherein said means for sensing comprises an inverter.

15. The apparatus as claimed in claim 14 wherein said multi-line cable is of the ribbon type.

16. An apparatus for detecting improper external connection of at least first and second cables each having multiple lines and constructed and arranged for connection between connector means for separately disposed first and second circuit boards, wherein each of said first and second circuit boards are each provided with first and second connector means respectively for the first and second cables, wherein each said first connector means includes a plurality of connector members corresponding to the number of cable lines of the first cable, and wherein each said second connector means includes a plurality of connector members corresponding to the number of cable lines of the second cable, said apparatus comprising;

first means for establishing a first predetermined electrical signal associated with the first connector means for the first circuit board and establishing on a first line of the first cable said first predetermined electrical signal identifiable as a correct cable connection signal, wherein said first means for establishing comprises a first signal generator connected to a preselected first connector member of the first connector means of the first circuit board;

first means for receiving and generating connected to a second connector member of the first connector means of the second circuit board and receiving from the first line the first predetermined electrical signal and generating a first error signal in the absence of the first predetermined electrical signal;

second means for establishing a second predetermined electrical signal associated with the second connector means of the first circuit board and establishing on a second line of the second cable said second predetermined electrical signal identifiable as a correct cable connection signal, said second means for establishing including a second signal generator connected to a preselected third connector member of the second connector means of the first circuit board; and second means for receiving and generating connected to a fourth connector member of the second connector means of the second circuit board and receiving from the second line the second predetermined electrical signal and generating a second error signal in the absence of the second predetermined electrical signal, whereby the successful reception, respectively by the first and second means for receiving and generating, of the first and second predetermined electrical signals respectively from said first and second means for establishing, respectively indicates proper connection of the first and second cables between the first and second circuit boards;

whereby a failure to receive the first predetermined electrical signal at said first means for receiving and generating indicates improper connection of the first cable between the first and second circuit boards; and whereby a failure to receive the second predetermined electrical signal at said second means for receiving and generating indicates improper connection of the second cable between the first and second circuit boards.

17. An apparatus as set forth in claim 16 wherein the preselected third connector member of the second connector means of the first circuit board has a relative position different from the relative position of the preselected first connector member of the first connector means of the first circuit board.

18. An apparatus as set forth in claim 1 wherein the second predetermined electrical signal is different from the first predetermined electrical signal.

19. An apparatus as set forth in claim 17 wherein:

said first means for receiving and generating comprises a first error detect circuit connected to the second connector member, of the first connector means of the second circuit board, having a relative position corresponding to the relative position of the preselected first connector member of the first connector means of the first circuit board; and said second means for receiving and generating comprises a second error detect circuit connected to the fourth connector member, of the second connector means of the second circuit board, having a relative position corresponding to the relative position of the preselected third connector member of the second connector means of the first circuit board.

20. An apparatus for detecting improper external connection of at least first and second cables each having multiple lines and constructed and arranged for connection between connector means of separately disposed first and second circuit boards, wherein each of said first and second circuit boards is provided with first and second connector means respectively for the first and second cables, wherein each of said first connector means includes a plurality of connector members corresponding to the number of cable lines of the first cable, and wherein each of said second connector means includes a plurality of connector members corresponding to the number of cable lines of the second cable said apparatus comprising:

a first signal generator, connected to a preselected first connector member of the first connector means of the first circuit board, for establishing on a first line of the first cable a first predetermined electrical signal identifiable as a correct cable connection signal;

first means for receiving and generating associated with the first connector means of the second circuit board and receiving from the first line the first predetermined electrical signal and generating a first error signal in the absence of the first predetermined electrical signal, wherein said first means for receiving and generating is connected to a second connector member, said second connector member having a position on the first connector means of the second circuit board corresponding to the position of the preselected first connector member on the first connector means of the first circuit board;

a second signal generator, connected to a preselected third connector member of the second connector means of the first circuit board, for establishing on a second line of the second cable a second predetermined electrical signal identifiable as a correct cable connection signal, wherein the preselected third connector member has a relative position on said second connector means of the first circuit board different from the relative position of the preselected first connector member on said first connector means of the first circuit board; and second means for receiving and generating associated with the second connector means of the second circuit board and receiving from the second line the second predetermined electrical signal and generating a second error signal in the absence of the second predetermined electrical signal, wherein said second means for receiving and generating is connected to a fourth connector member having a position on the second connector means of the second circuit board corresponding to the position of the preselected third connector member on the second connector means of the first circuit board;

whereby the successful reception, respectively by the first and second means for receiving and generating, of the first and second predetermined electrical signals respectively from said first and second signal generators, respectively indicates proper connection of the first and second cables between the first and second circuit board;

whereby a failure to receive the first predetermined electrical signal at said first means for receiving and generating indicates improper connection of the first cable between the first and second circuit boards; and whereby a failure to receive the second predetermined electrical signal at said second means for receiving and generating indicates improper connection of the second cable between the first and second circuit boards.

21. An apparatus as set forth in claim 20 wherein the second predetermined electrical signal is different from the first predetermined electrical signal.

22. An apparatus for detecting improper external connection of at least first and second cable each having multiple lines and constructed and arranged for connection between connector means of separately disposed first and second circuit boards, wherein each of said first and second circuit boards is provided with first and second connector means respectively for the first and second cables, wherein each of said first connector means includes a plurality of connector members corresponding to the number of cable lines of the first cable, and wherein each of said second connector means includes a plurality of connector members corresponding to the number of cable lines of the second cable, said apparatus comprising:

a first signal generator, connected to a preselected first selector member of the first connector means of the first circuit board, for establishing on a first line of the first cable a first predetermined electrical signal identifiable as a correct cable connection signal;

a first means for receiving and generating associated with the first connector means of the second circuit board and receiving from the first line the first predetermined electrical signal and generating a first error signal in the absence of the first predetermined electrical signal, wherein said first means for receiving and generating is connected to a second connector member having a position o the first connector means of the second circuit board corresponding to the position of the preselected first connector member on the first connector means of the first circuit board;

a second signal generator, connected to a preselected third connector member of the second connector means of the second circuit board, for establishing on a second line of the second cable a second predetermined electrical signal identifiable as a correct cable connection signal, wherein the preselected third connector member has a relative position on the second connector means of the second circuit board different from the relative position of the preselected second connector member on the first connector means of the second circuit board; and second means for receiving and generating associated with the second connector means of the first circuit board and receiving from the second line the second predetermined electrical signal and generating a second error signal in the absence of the second predetermined electrical signal, wherein said second means for receiving and generating is connected to a fourth connector member having a position on the second connector means of the first circuit board corresponding to the position of the preselected third connector member on the second connector means of the second circuit board;

whereby the successful reception, respectively by the first and second means for receiving and generating, of the first and second predetermined electrical signals respectively from said first and second signal generators, respectively indicates proper connection of the first and second cables between the first and second circuit boards;

whereby a failure to receive the first predetermined electrical signal at said first means for receiving and generating indicates improper connection of the first cable between the first nd second circuit boards; and whereby a failure to receive the second predetermined electrical signal at said second means for receiving and generating indicates improper connection of the second cable between the first and second circuit boards.

23. An apparatus as set forth in claim 22 wherein the second predetermined electrical signal is different from the first predetermined electrical signal.

* * * * *